(12) United States Patent
Chang et al.

(10) Patent No.: US 12,094,870 B2
(45) Date of Patent: *Sep. 17, 2024

(54) ELECTROSTATIC DISCHARGE CIRCUITS AND METHODS FOR OPERATING THE SAME

(71) Applicant: TAIWAN SEMICONDUCTOR MANUFACTURING COMPANY LTD., Hsinchu (TW)

(72) Inventors: Tzu-Heng Chang, New Taipei (TW); Hsin-Yu Chen, Hsinchu (TW); Pin-Hsin Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/356,217

(22) Filed: Jul. 21, 2023

(65) Prior Publication Data

US 2023/0369316 A1 Nov. 16, 2023

Related U.S. Application Data

(63) Continuation of application No. 17/351,111, filed on Jun. 17, 2021, now Pat. No. 11,798,936.

(Continued)

(51) Int. Cl.
*H01L 27/02* (2006.01)
*H02H 9/04* (2006.01)

(52) U.S. Cl.
CPC ......... *H01L 27/0266* (2013.01); *H02H 9/046* (2013.01)

(58) Field of Classification Search
CPC ...... H01L 27/0266; H02H 9/046; H02H 9/04; H02H 9/044; H02H 9/045

(Continued)

(56) References Cited

U.S. PATENT DOCUMENTS

| 7,719,806 B1* | 5/2010 | Boyd | H01L 27/027 361/56 |
| 10,256,224 B2* | 4/2019 | Isobe | H03K 17/687 |

(Continued)

FOREIGN PATENT DOCUMENTS

| CN | 106786463 A * | 5/2017 | H02H 9/04 |
| DE | 102021101690 A1 * | 8/2021 | H01L 27/0266 |

*Primary Examiner* — Dharti H Patel
(74) *Attorney, Agent, or Firm* — WPAT LAW; Anthony King

(57) ABSTRACT

The present disclosure provides electrostatic discharge circuits and structures and methods for operating the electrostatic discharge circuits and structures. A circuit includes a first transistor and a second transistor. The first transistor includes a drain, a source, a gate, and a bulk. The drain of the first transistor is connected to a first terminal. The source of the first transistor is connected to receive a first voltage. The gate and the bulk of the first transistor is connected to receive a second voltage. The second transistor includes a drain, a source, a gate, and a bulk. The source, the gate, and the bulk of the second transistor is connected to receive the second voltage. The drain of the second transistor is connected to the first terminal. In response to the terminal reaching a trigger voltage, the first transistor is configured to be turned on.

20 Claims, 7 Drawing Sheets

Related U.S. Application Data

(60) Provisional application No. 63/157,167, filed on Mar. 5, 2021.

(58) Field of Classification Search
USPC .......................................................... 361/56
See application file for complete search history.

(56) References Cited

U.S. PATENT DOCUMENTS

| | | | |
|---|---|---|---|
| 11,302,686 B2* | 4/2022 | Chen | H02H 9/045 |
| 2010/0208400 A1* | 8/2010 | Jeon | H01L 27/0266 |
| | | | 257/360 |
| 2013/0182357 A1* | 7/2013 | Brodsky | H01L 27/0281 |
| | | | 361/56 |
| 2013/0229736 A1* | 9/2013 | Van Der Borght | H02H 9/044 |
| | | | 361/56 |
| 2013/0342940 A1* | 12/2013 | Taghizadeh Kaschani | H02H 9/046 |
| | | | 361/56 |
| 2022/0352704 A1* | 11/2022 | Lin | H02H 9/04 |

\* cited by examiner

ELECTROSTATIC DISCHARGE CIRCUITS AND METHODS FOR OPERATING THE SAME

PRIORITY CLAIM AND CROSS-REFERENCE

This application claims priority to U.S. patent application Ser. No. 17/351,111 filed on Jun. 17, 2021, and U.S. Provisional Application No. 63/157,167 filed on Mar. 5, 2021, entitled "SNAPBACK ESD," which application is hereby incorporated herein by reference.

BACKGROUND

An electronic device, e.g., a chip or integrated circuit, may accumulate electrostatic charges thereon. The electronic device may be damaged or even destroyed if the accumulated electrostatic charges are not discharged properly. Electrostatic discharge (ESD) protection may be called upon to discharge the accumulated electrostatic charges.

BRIEF DESCRIPTION OF THE DRAWINGS

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

Figure 1:
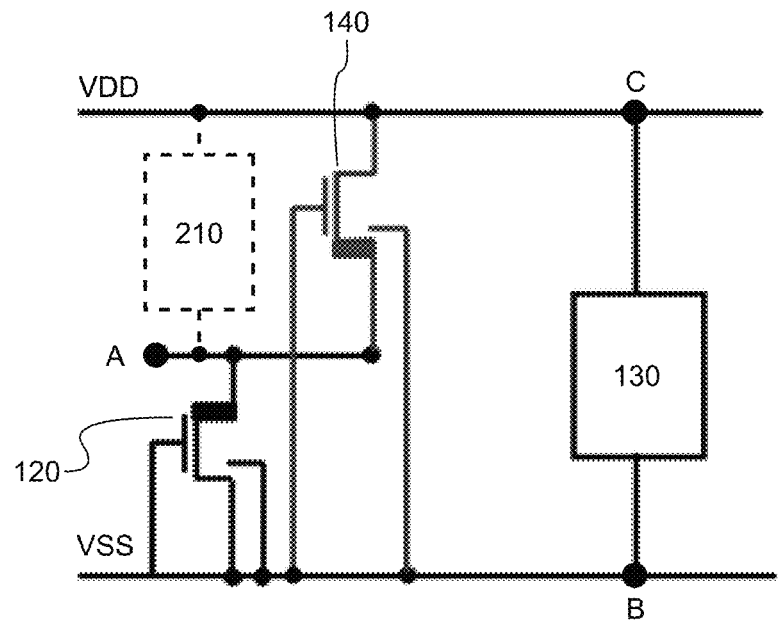
FIG. 1 is a schematic diagram of an ESD circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The nature and use of the embodiments are discussed in detail as follows. It should be appreciated, however, that the present disclosure provides many applicable inventive concepts that can be embodied in a wide variety of specific contexts. The specific embodiments discussed are merely illustrative of specific ways to embody and use the disclosure, without limiting the scope thereof.

Electrostatic discharge (ESD) protection structures, used with integrated circuits, can provide a path to bypass current from a terminal to a ground or from a terminal to a power supply rail, whereby current due to an ESD event bypasses a sensitive internal circuitry. Voltages far in excess of normal operating voltages, in both positive and negative magnitudes, are observed during short duration electrostatic discharge events. ESD protection structures prevent the ESD event-based current from harming sensitive components in an integrated circuit. Without ESD protection the devices coupled to the power terminal could fail.

FIG. 1 is a schematic diagram of a circuit 100 in accordance with some embodiments of the present disclosure. The circuit 100 may include transistors 120 and 140, and a power clamp module 130. A component 210 may be connected to the circuit 100. The component 210 may be protected from an ESD event.

Two power rails may be provided in the circuit 100. The upper power rail may supply voltage VDD. The lower power rail may supply voltage VSS. The voltage VDD may exceed the voltage VSS. In some embodiments, the voltage VDD may be a positive power supply. In some embodiments, the voltage VSS may be ground. The elements of the circuit 100 may be connected between the power rail of voltage VDD and the power rail of voltage VSS.

According to the circuit 100, the component 210 may be protected from an ESD event. The component 210 may be referred to as a victim component. The component 210 may be connected to the power rail of voltage VDD to receive the voltage VDD. The component 210 may be connected to the terminal A. The component 210 may be connected between the power rail of voltage VDD and the terminal A. The terminal A may be an input, input/output, or output pad. In some embodiments, the terminal A may be referred to as a pad terminal. A pad terminal may be, in an example application, an input, output, or input/output terminal of an integrated circuit formed on a semiconductor substrate. In some embodiments, the component 210 may be or may include any circuits, modules, or systems which may be suffered from ESD events.

ESD events typically occur between an input, input/output, or output pad and another terminal, either VSS or VDD. ESD stress modes may be categorized into PS mode strike, for positive voltage from a pad to VSS, PD mode strike, for positive voltage from a pad to VDD, NS mode strike, for negative voltage from a pad to VSS, or ND mode strike for negative voltage from a pad to VDD.

The transistor 120 may be connected to the power rail of voltage VSS to receive the voltage VSS. The transistor 120 may be connected to the terminal A. The transistor 120 may be connected between the power rail of voltage VSS and the terminal A. The transistor 120 may be an n-type transistor. The drain of the transistor 120 may be connected to the terminal A. The source, the bulk (or body), and the gate of the transistor 120 may be connected to the power rail of voltage VSS. The source, the bulk (or body), and the gate of the transistor 120 may be connected to receive the voltage VSS.

The transistor 140 may be connected to the power rail of voltage VDD to receive the voltage VDD. The transistor 140 may be connected to the terminal A. The transistor 140 may be connected between the power rail of voltage VDD and the terminal A. The transistor 140 may be an n-type transistor. The drain of the transistor 140 may be connected to the terminal A. The source of the transistor 140 may be connected to the power rail of voltage VDD. The source of the transistor 140 may be connected to receive the voltage VDD. The bulk (or body) and the gate of the transistor 140 may be connected to the power rail of voltage VSS. The bulk (or body) and the gate of the transistor 140 may be connected to receive the voltage VSS.

The transistors 120 and 140 may be n-type transistors. The transistors 120 and 140 may be n-type field-effect transistors (FETs). The transistors 120 and 140 may be n-type metal-oxide-semiconductor field-effect transistors (MOSFETs). The transistors 120 and 140 may be drain extended n-type MOSFETs.

The gates of the transistors 120 and 140 may be connected to ground, and the transistors 120 and 140 may not be turned on when the component 210 operates in a normal mode. Because the transistors 120 and 140 may be drain extended transistors, when a high voltage spike is applied to the transistor 120 or 140, the transistor 120 or 140 applied with the high voltage spike may be turned on as a bipolar junction transistor (BJT). The transistors 120 and 140 may exhibit a characteristic called "snapback." The characteristic of snapback may refer to that when a high voltage spike is applied to a transistor, the transistor may be turned on.

In some embodiments, the power clamp module 130 may work as a diode (e.g., a power clamp body diode). The power clamp body diode may have a forward threshold voltage. If the voltage difference between nodes B and C exceeds the forward threshold voltage, the power clamp body diode may conduct, and current may flow from the node B to the node C. If the voltage difference between nodes B and C less than the forward threshold voltage, the conduction of the power clamp body diode may cease.

As shown in FIG. 1, in an ESD event, the electrostatic charges may be discharged through the transistors 120 and 140 and the power clamp circuit 130. According to the circuit 100, the trigger voltage of the ESD may be much reduced.

Figure 2:
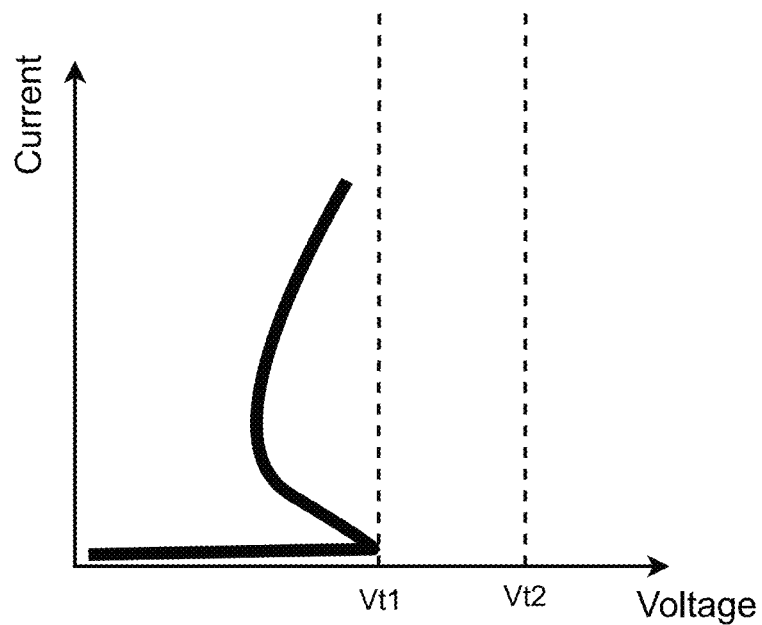
FIG. 2 shows a current-voltage curve in accordance with some embodiments of the present disclosure.

FIG. 2 shows a current-voltage curve in accordance with some embodiments of the present disclosure. The current-voltage shown in FIG. 2 may be drawn according to the measurements at the terminal A. In FIG. 2, the x-axis may represent the voltage between the drain and the source of the transistor 120 or 140, and the y-axis may represent the current flowing through the transistor 120 or 140.

As shown in FIG. 2, if the voltage between the drain and the source of the transistor 120 or the transistor 140 is below a voltage Vt1 (which may be the threshold voltage or trigger voltage of the transistor 120 or 140), the transistor 120 or the transistor 140 may be turned off, and no current flows through the transistor 120 or the transistor 140. When the applied voltage (e.g., the voltage between the drain and source) is above the voltage Vt1, the transistors 120 and 140 may be turned on.

The voltage Vt2 may be a breakdown voltage of the component 210. If the voltage at the terminal A is above the voltage Vt2, the component 210 may be damaged. The voltage Vt2 may increase if the number of elements (e.g., transistors) stacked in the component 210 increases.

If a trigger voltage of an ESD circuit is too close to the breakdown voltage (e.g., the voltage Vt2) of the component 210, the ESD circuit may not be triggered in time when electrostatic charges are rapidly accumulated at the terminal (e.g., the terminal A) of a circuit (e.g., the component 210) to be protected. This may damage the circuit.

To enhance the robustness of the ESD circuit, especially under a PD mode strike, the trigger voltage of the ESD circuit may be reduced. In some embodiments of the present disclosure, the ESD circuit (e.g., the transistors 120, 140; the circuit 100 without the component 210) has a relatively low trigger voltage (e.g., the voltage Vt1). Therefore, even if the voltage at the terminal A increases too fast due to the rapidly accumulated electrostatic charges, the ESD circuit (e.g., the transistors 120, 140; the circuit 100 without the component 210) may be triggered in time, and the component 210 may be protected from being damaged.

From the current-voltage curve shown in FIG. 2, the voltage may reduce in response to the voltage reaching the trigger voltage Vt1. Before the voltage reaches the voltage Vt1, the current is very small. In response to the voltage reaching the voltage Vt1, the current increases.

Figure 3:
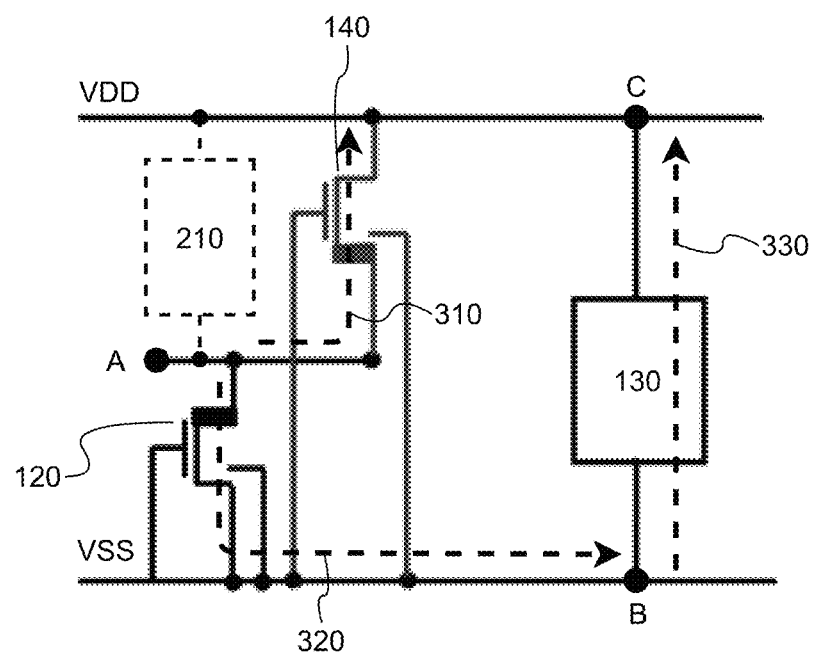
FIG. 3 depicts electrostatic discharge paths in accordance with some embodiments of the present disclosure.

FIG. 3 depicts electrostatic discharge paths 310, 320, and 330 in accordance with some embodiments of the present disclosure. FIG. 3 depicts electrostatic discharge paths 310, 320, and 330 in accordance with the circuit 100. In response to the voltage at the terminal A reaching a given trigger voltage (e.g., the voltage Vt1), the electrostatic charges may be discharged through one or more of the paths 310, 320, and 330.

In the path 310, the electrostatic charges may be discharged from the terminal A, the drain of the transistor 140, the source of the transistor 140, and the power rail of voltage VDD. In the path 320, the electrostatic charges may be discharged from the terminal A, the drain of the transistor 120, the source of the transistor 120, the power rail of voltage VSS, and one end of the power clamp module 130 (i.e., the node B). In the path 330, the electrostatic charges may be discharged from the power rail of voltage VSS (i.e., the node B), the power clamp module 130, and the power rail of voltage VDD (i.e., the node C).

The trigger voltage for the path 310 may be smaller than, or not greater than, the trigger voltage for the paths 320 and 330. The path 310 may be turned on prior to the paths 320 and 330. The paths 310, 320, and 330 may be turned on simultaneously. Because of the path 310, the overall trigger voltage of the circuit 100 may be much reduced. The robustness of the circuit 100 may be thus much enhanced.

The paths 320 and 330 may be combined into one discharge path under a PD mode strike. The electrostatic charges may be discharged through two paths (e.g., the path 310 and the combination of the paths 320 and 330). The robustness of the circuit 100 may be thus much enhanced.

Figure 4:
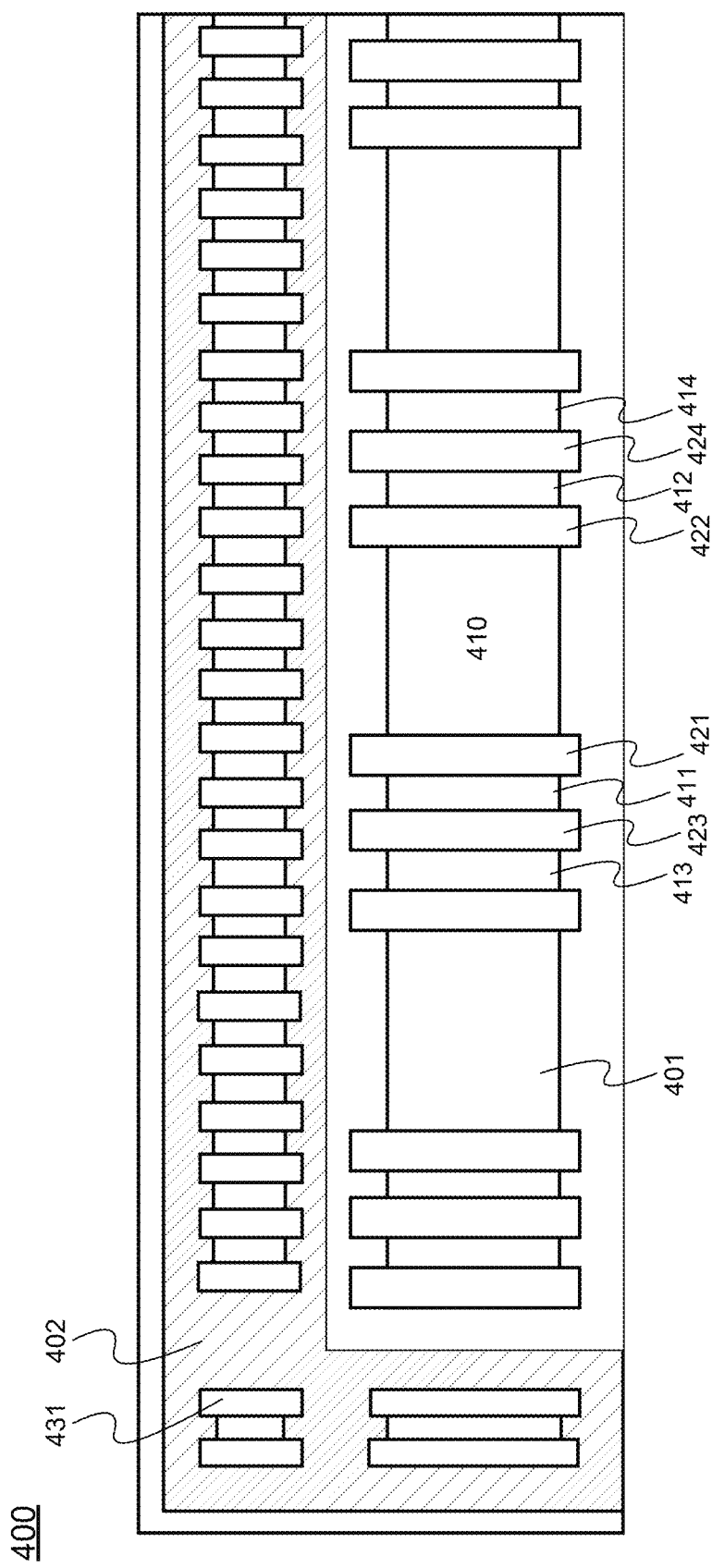
FIG. 4 is a plan view of an ESD structure in accordance with some embodiments of the present disclosure.

FIG. 4 is a plan view of an ESD structure in accordance with some embodiments of the present disclosure. FIG. 4 may be a plan view of a semiconductor 400. The region 401 may be an oxide defined region. The region 401 may be a substrate of a first conductivity type. The region 401 may be a p-type substrate. The region 402 may be a first type implant region in a first type well, e.g. a p+ implant region in a p well.

The region 410 may be formed within the region 401. The region 410 may be a doped area of a second conductivity type, e.g. an n-type doped area. The stripes (or areas) 411, 412, 413, and 414 may be formed within the region 401. The stripes (or areas) 411, 412, 413, and 414 may be doped stripes (or doped areas) of a second conductivity type, e.g. n-type doped stripes.

The stripes 421, 422, 423, 424, and 431 may be made of polysilicon or metal. The stripes 421, 422, 423, and 424 may be formed on the region 401. The stripe 431 may be formed on a region within the region 402.

The region 410 may be the drain of a pull up snapback device (e.g., the transistor 140) and a pull down snapback device (e.g., the transistor 120). The region 410 may be shared by the drains of the pull up snapback device and the pull down snapback device. The region 410 may be wider than the stripes 411, 412, 413, or 414. The area, leakage, and capacitance increment by the circuit of the present disclosure (e.g., the circuit 100) may thus be controlled. The area of the circuit of the present disclosure (e.g., the circuit 100) may thus be reduced from about 1.3 times to about 2 times of a snapback device.

The stripes 411 and 414 may be the source of the pull up snapback device. The stripe 412 and 413 may be the source of the pull down snapback device. The stripes 421, 422, 423, and 424 may be the gates of the pull up snapback device and the pull down snapback device.

The semiconductor 400 may correspond to the circuit 100. The region 410 may be connected to a pad terminal (e.g., the terminal A). The stripes 411 and 414 may be connected to receive the voltage VDD. The stripe 412 and 413 may be connected to receive the voltage VSS. In accordance with the embodiments of circuit 100, the stripes 421, 422, 423, and 424 may be connected to receive the voltage VSS. The stripe 431 may be connected to receive the voltage VSS.

Figure 5:
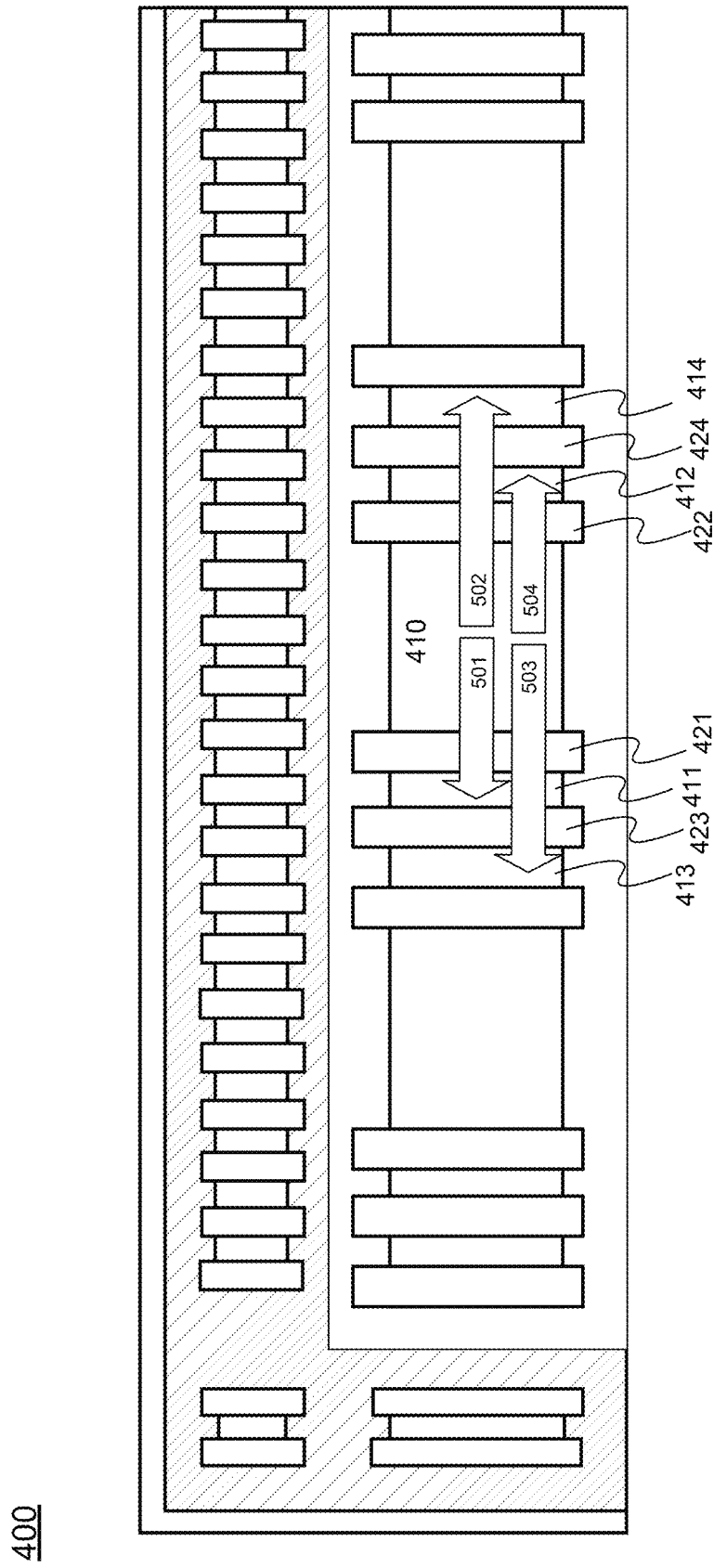
FIG. 5 depicts electrostatic discharge paths in accordance with some embodiments of the present disclosure.

FIG. 5 depicts electrostatic discharge paths 501, 502, 503, and 504 in accordance with some embodiments of the present disclosure. FIG. 5 depicts electrostatic discharge paths 501, 502, 503, and 504 in accordance with the semiconductor 400.

In path 501, the region 410 and the stripe 411 may be conducted. In path 502, the region 410 and the stripe 414 may be conducted. In path 503, the region 410 and the stripe 413 may be conducted. In path 504, the region 410 and the stripe 412 may be conducted.

In some embodiments, in response to a given positive voltage (e.g., the voltage Vt1) from a pad terminal (i.e., the pad terminal connected to the region 410) to the voltage VDD being reached (i.e., a PD mode strike), the electrostatic charges may be discharged through the paths 501 and 502. In some embodiments, in response to a given positive voltage from a pad terminal (i.e., the pad terminal connected to the region 410) to the voltage VSS being reached (i.e., a PS mode strike), the electrostatic charges may be discharged through the paths 503 and 504.

The pull up snapback device may have two parasitic NPN channels, one of which may include region 410 and the stripe 411 and the other may include region 410 and the stripe 414. The two parasitic NPN channels of the pull up snapback device may be parallel and have different base widths.

The pull down snapback device may have two parasitic NPN channels, one of which may include region 410 and the stripe 412 and the other may include region 410 and the stripe 413. The two parasitic NPN channels of the pull up snapback device may be parallel and have different base widths.

In accordance with the embodiments of the present disclosure, the semiconductor 400 may take less time to turn on the NPN channels and provide a longer turn-on duration for the NPN channels during an ESD event.

Figure 6:
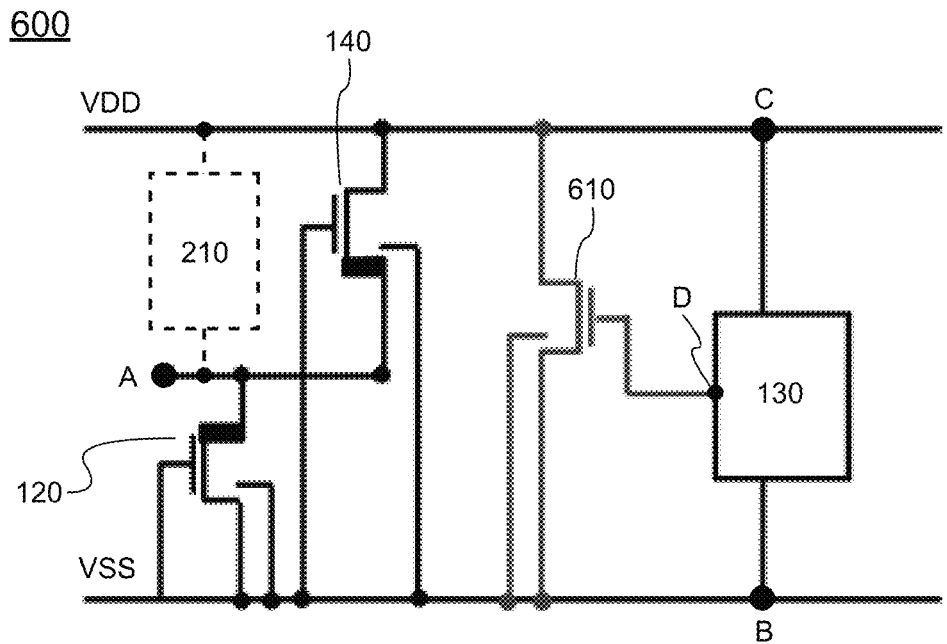
FIG. 6 is a schematic diagram of an ESD circuit in accordance with some embodiments of the present disclosure.

FIG. 6 is a schematic diagram of a circuit 600 in accordance with some embodiments of the present disclosure. The circuit 600 may include transistors 120, 140, 610, a power clamp module 130, and a terminal A. A component 210 may be connected to the circuit 600. The component 210 may be protected from an ESD event.

Two power rails may be provided in the circuit 600. The upper power rail may supply voltage VDD. The lower power rail may supply voltage VSS. The voltage VDD may exceed the voltage VSS. In some embodiments, the voltage VDD may be positive power supply. In some embodiments, the voltage VSS may be ground. The elements of the circuit 600 may be connected between the power rail of voltage VDD and the power rail of voltage VSS.

With respect to the circuit 100 of FIG. 1, the circuit 600 may further include the transistor 610 and node D. The transistor 610 may be connected to the power rail of voltage VDD to receive the voltage VDD. The transistor 610 may be connected to the power rail of voltage VSS to receive the voltage VSS. The transistor 610 may be connected between the power rail of voltage VDD and the power rail of voltage VSS. The transistor 610 may be an n-type transistor. The drain and the bulk (or body) of the transistor 610 may be connected to the power rail of voltage VSS. The drain and the bulk (or body) of the transistor 610 may be connected to receive the voltage VSS. The source of the transistor 610 may be connected to the power rail of voltage VDD. The source of the transistor 610 may be connected to receive the voltage VDD. The gate of the transistor 610 may be connected to the power clamp module 130 at the node D. The gate of the transistor 610 may be connected to a R-C inverter node of the power clamp module 130. The transistor 610 may be turned on during an ESD event of the circuit 600. The transistor 610 may be used to discharge electrostatic charges during an ESD event of the circuit 600.

The transistor 610 may be an n-type MOSFET. The transistor 610 may be an embedded n-type MOSFET. In some embodiments, the transistor 610 may be an embedded NMOS, and the transistor 120 and 140 may be drain extended n-type MOSFETs.

Figure 7:
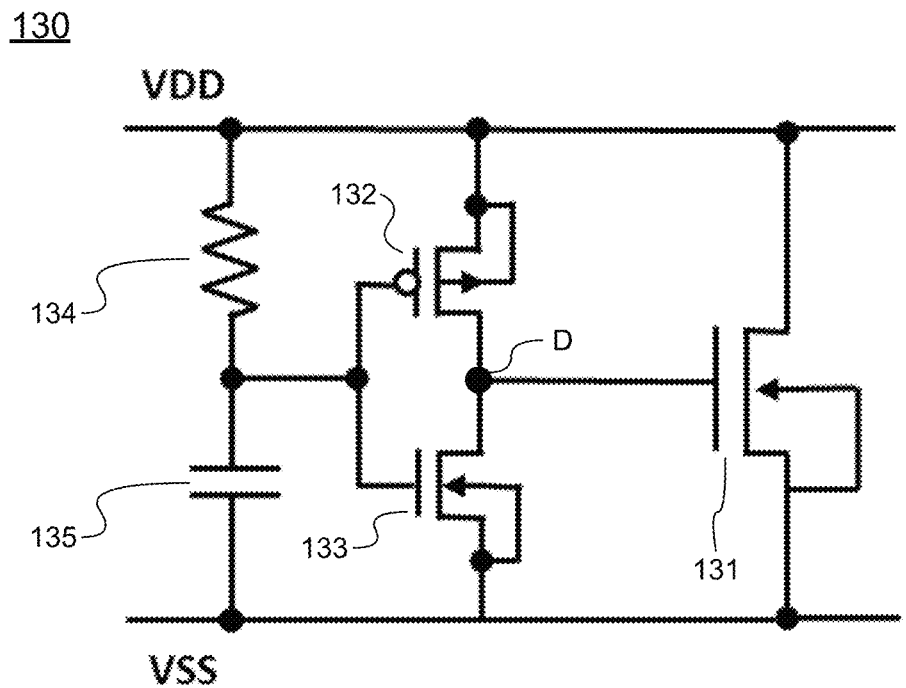
FIG. 7 is a schematic diagram of a power clamp module in accordance with some embodiments of the present disclosure.

FIG. 7 is a schematic diagram of the power clamp module 130 in accordance with some embodiments of the present disclosure. The power clamp module 130 may include transistors 131, 132, 133, a resistor 134, a capacitor 135, and the node D. The node D in FIG. 7 may correspond to the node D in FIG. 6.

The transistors 131 and 133 may be n-type transistors. The transistors 131 and 133 may be n-type MOSFETs. The gate of the transistor 131 may be connected to the bulk of the transistor 131. The gate of the transistor 133 may be connected to the bulk of the transistor 133. The transistor 131 may be a big field-effect transistor (FET). The channel width of the transistor 131 may exceed 1000 μm. The transistor 131 may be a local big FET in an IO (input/output) cell. A local big FET may reduce voltage drop during a ND mode strike.

The transistor 132 may be a p-type transistor. The transistor 132 may be a p-type MOSFET. The gate of the transistor 132 may be connected to the bulk of the transistor 132.

The transistor 131 may be a n-type transistor. The drain of the transistor 131 may be connected to the power rail of voltage VDD. The source of the transistor 131 may be connected to the power rail of voltage VSS. The gate of the transistor 131 may be connected to the node D.

The transistor 132 may be a p-type transistor. The source of the transistor 132 may be connected to the power rail of voltage VDD. The drain of the transistor 132 may be connected to the node D. The gate of the transistor 132 may be connected to the gate of the transistor 133, the resistor 134, and the capacitor 135.

The transistor 133 may be a n-type transistor. The drain of the transistor 133 may be connected to the node D. The source of the transistor 133 may be connected to the power rail of voltage VSS. The gate of the transistor 133 may be connected to the gate of the transistor 132, the resistor 134, and the capacitor 135. The gate of the transistor 131, the drain of the transistor 132, and the drain of the transistor 133 may be connected to each other at the node D.

An end of the resistor 134 may be connected to the power rail of voltage VDD. The other end of the resistor 134 may be connected to the capacitor 135, the gate of the transistor 132, and the gate of the transistor 133. An end of the capacitor 135 may be connected to the power rail of voltage VSS. The other end of the capacitor 135 may be connected to the resistor 134, the gate of the transistor 132, and the gate of the transistor 133.

The turn-on duration of an ESD clamp device (e.g., the power clamp module 130) may be mainly controlled by the RC time constant. The RC time constant may be large enough, at about several hundreds of ns to keep the ESD clamp device "ON" during an ESD event. However, the extended RC time constant may require a larger layout area for resistor and capacitor.

Referring to FIG. 4 again, the semiconductor 400 may correspond to the circuit 600. The region 410 may be connected to a pad terminal (e.g., the terminal A). The stripes 411 and 414 may be connected to receive the voltage VDD. The stripes 412 and 413 may be connected to receive the voltage VSS. In accordance with the embodiments of circuit 600, the stripes 421 and 422 may be connected to receive the voltage VSS. In accordance with the embodiments of circuit 600, the stripes 423 and 424 may be connected to receive the R-C inverter node of the power clamp module 130 (e.g., at the node D of FIGS. 6 and 7). The stripe 431 may be connected to receive the voltage VSS. In accordance with the embodiments of circuit 600, an embedded NMOS may be disposed between the stripes 411 and 413 and between the stripes 412 and 414. In accordance with the embodiments of circuit 600, the stripes 423 and 424 may be the gate of the embedded NMOS.

In accordance with the embodiments of the present disclosure, the semiconductor (e.g., the semiconductor 400) may have a shorter period to turn on the NPN channels and may have a longer turn-on duration for the NPN channels during an ESD event. The present disclosure may not need larger layout area for the resistor and the capacitor to obtain longer turn-on duration.

Figure 8:
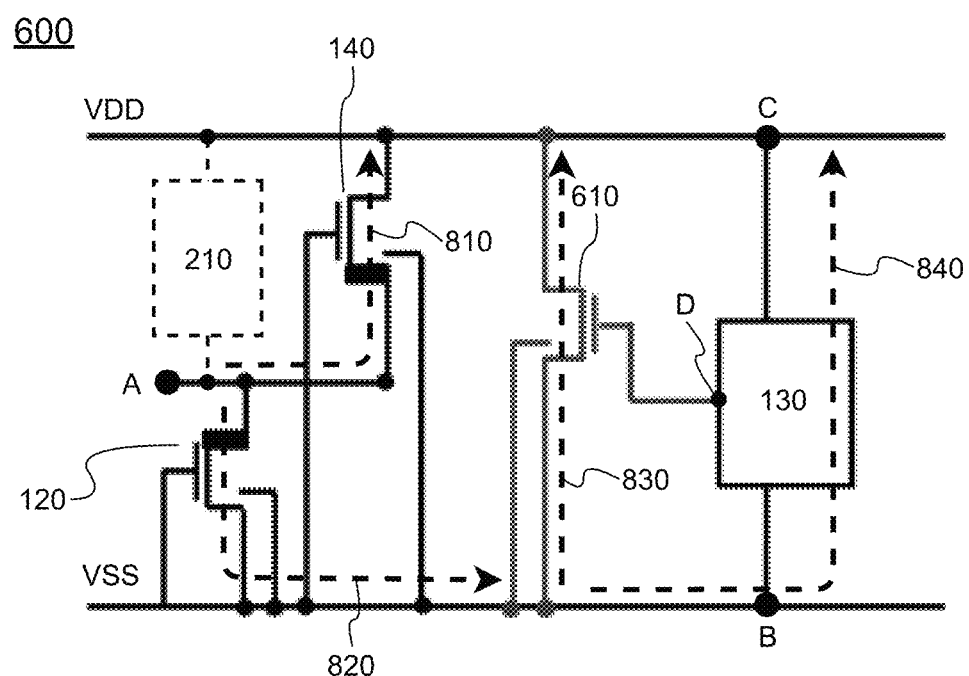
FIG. 8 depicts electrostatic discharge paths in accordance with some embodiments of the present disclosure.

FIG. 8 depicts electrostatic discharge paths 810, 820, 830, 840 in accordance with some embodiments of the present disclosure. FIG. 8 depicts electrostatic discharge paths 810, 820, 830, 840 in accordance with the circuit 600. In response to the voltage at the terminal A reaching a given trigger voltage (e.g., the voltage Vt1), the electrostatic charges may be discharged through one or more of the paths 810, 820, 830, 840.

In the path 810, the electrostatic charges may be discharged from the terminal A, the drain of the transistor 140, the source of the transistor 140, and the power rail of voltage VDD. In the path 820, the electrostatic charges may be discharged from the terminal A, the drain of the transistor 120, the source of the transistor 120, the power rail of voltage VSS, and the drain of the transistor 610. In the path 830, the electrostatic charges may be discharged from the drain of the transistor 610, the source of the transistor 610, and the power rail of voltage VDD. In the path 840, the electrostatic charges may be discharged from the power rail of voltage VSS (i.e., the node B), the power clamp module 130, and the power rail of voltage VDD (i.e., the node C).

The trigger voltage for the path 810 may be smaller than, or not greater than, the trigger voltage for the paths 820, 830, and 840. The path 810 may be turned on prior to the paths 820, 830, and 840. The paths 810, 820, 830, and 840 may be turned on simultaneously. Because of the path 810, the overall trigger voltage of the circuit 600 may be much reduced. The robustness of the circuit 600 may be thus much enhanced.

The electrostatic charges on the paths 830 and 840 may be divided from the electrostatic charges on the path 820 during a PD mode strike. The electrostatic charges may be discharged through three paths (e.g., the path 810, the combination of the paths 820 and 830, and the combination of the paths 820 and 840). The robustness of the circuit 600 may be thus much enhanced.

Figure 9:
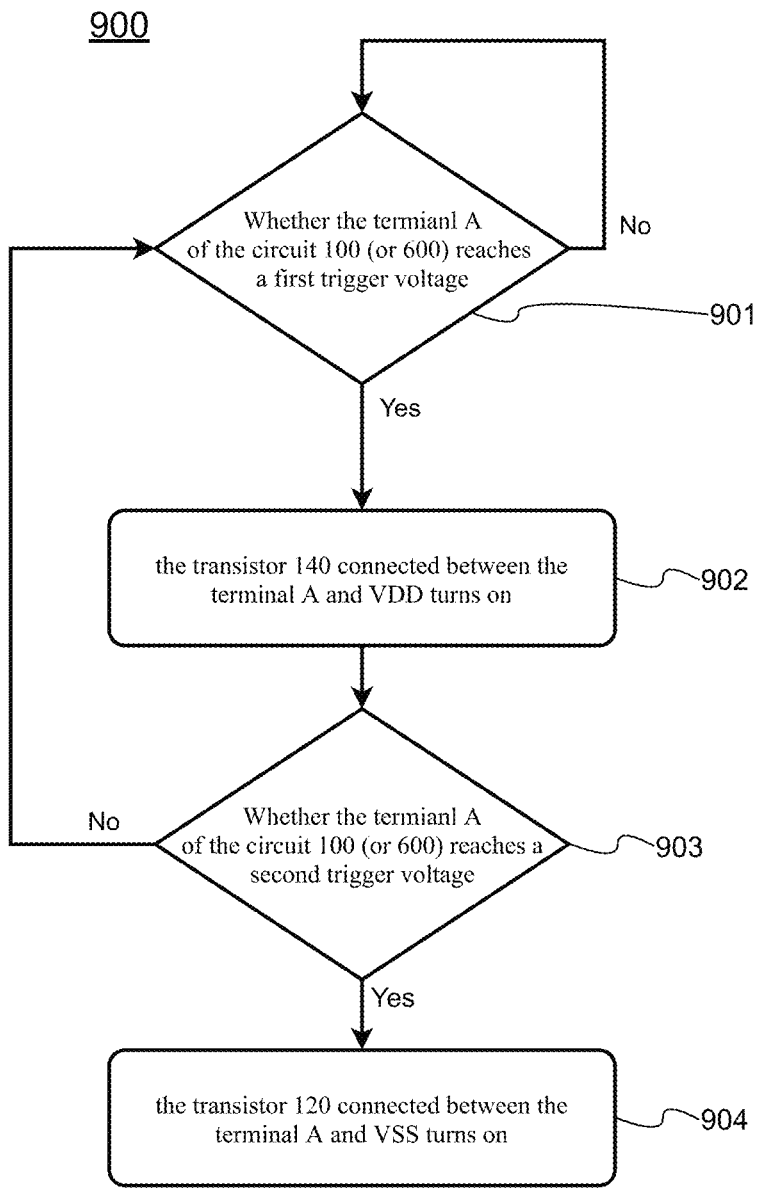
FIG. 9 is a flowchart of a method for operating an ESD circuit in accordance with some embodiments of the present disclosure.

FIG. 9 is a flowchart of a method for operating an ESD circuit in accordance with some embodiments of the present disclosure. FIG. 9 may be a flowchart of a method 900 for operating the circuit 100 or 600 in accordance with some embodiments of the present disclosure.

In operation 901, it is determined whether the terminal A of the circuit 100 (or 600) reaches a first trigger voltage (e.g., the voltage Vt1). If the terminal A of the circuit 100 (or 600) does not reach the first trigger voltage, the operation 901 may be repeated. If the terminal A of the circuit 100 (or 600) reaches the first trigger voltage, the operation 902 may be performed.

In operation 902, in response to the terminal A of the circuit 100 (or 600) reaching the first trigger voltage, the transistor 140 connected between the terminal A and the power rail of voltage VDD would be turned on. In response to the terminal A of the circuit 100 (or 600) reaching the first trigger voltage, the transistor 140 may be turned on as a BJT.

After the operation 902, operation 903 may be performed. In operation 903, it is determined whether the terminal A of the circuit 100 (or 600) reaches a second trigger voltage (e.g., a voltage greater than the voltage Vt1, or a voltage not smaller than the voltage Vt1). If the terminal A of the circuit 100 (or 600) does not reach the first trigger voltage, the operation 901 may be performed. If the terminal A of the circuit 100 (or 600) reaches the second trigger voltage, the operation 904 may be performed.

In operation 904, in response to the terminal A of the circuit 100 (or 600) reaching the second trigger voltage, the transistor 120 connected between the terminal A and the power rail of the voltage VSS may be turned on. In response to the terminal A of the circuit 100 (or 600) reaching the second trigger voltage, the transistor 120 may be turned on as a BJT.

In some embodiments, the method 900 may not include operation 903. When the method 900 does not include operation 903, operation 904 may be performed after operation 902. When the method 900 does not include operation 903, the transistor 120 may turn on after the transistor 104 turns on. In operation 904, the transistor 120 may be turned on as a BJT.

In some embodiments of the method 900, in response to the terminal A of the circuit 100 (or 600) reaching the first trigger voltage, the transistor 140 may be turned on, and then the transistor 120 may be turned on.

In some embodiments, the method 900 may further include an operation of the power clamp module 130 being turned on. In other embodiments, the method 900 may further include an operation of the power clamp module 130 turning on in response to the terminal A of the circuit 100 (or 600) reaching the second trigger voltage. The method 900 may further include an operation of the power clamp module 130 turning on in response to the transistor 140 being turned on.

In further embodiments, the method 900 may further include an operation of a current flowing through the power clamp module 130 in response to the terminal A of the circuit 100 (or 600) reaching the second trigger voltage. The method 900 may further include an operation of a current flowing through the power clamp module 130 in response to the transistor 140 being turned on.

In some embodiments, the method 900 may further include an operation of the transistor 610 being turned on. In other embodiments, the method 900 may further include an operation of the transistor 610 being turned on in response to the terminal A of the circuit 600 reaching the second trigger voltage. The method 900 may further include an operation of the transistor 610 being turned on in response to the power clamp module 130 being turned on. The method 900 may further include an operation of the transistor 610 being turned on in response to the transistor 120 being turned on.

In further embodiments, the method 900 may further include an operation of a current flowing through the transistor 610 in response to the terminal A of the circuit 600 reaching the second trigger voltage. The method 900 may further include an operation of a current flowing through the transistor 610 in response to the power clamp module 130 being turned on. The method 900 may further include an operation of a current flowing through the transistor 610 in response to the transistor 120 being turned on.

In some embodiments, the present disclosure provides a circuit. The circuit may include a first transistor and a second transistor. The first transistor may include a drain, a source, a gate, and a bulk. The drain of the first transistor may be connected to a first terminal. The source of the first transistor may be connected to receive a first voltage. The gate and the bulk of the first transistor may be connected to receive a second voltage. The second transistor may include a drain, a source, a gate, and a bulk. The source, the gate, and the bulk of the second transistor may be connected to receive the second voltage. The drain of the second transistor may be connected to the first terminal. In response to the first terminal reaching a trigger voltage, the first transistor may be configured to be turned on.

In some embodiments, the present disclosure provides a semiconductor device. The semiconductor device may include a substrate of a first conductivity type; a first doped region of a second conductivity type; a first doped stripe of the second conductivity type; a second doped stripe of the second conductivity type; a third doped stripe of the second conductivity type; and a fourth doped stripe of the second conductivity type. The first and fourth doped stripes may be configured to receive a first voltage. The first doped stripe is between the first doped region and the third doped stripe. The second doped stripe is between the first doped region and the fourth doped stripe. The second and third doped stripes may be configured to receive a second voltage lower than the first voltage. The first doped region may be configured as a drain of a pull up snapback transistor and a drain of a pull down snapback transistor. The first doped region may be wider than the first, second, third, and fourth stripes.

In some embodiments, the present disclosure provides a method of operating a circuit. The method may include: in response to a first terminal reaching a first trigger voltage, turning on a first transistor connected between the first terminal and a first voltage; and in response to the first terminal reaching a second trigger voltage, turning on a second transistor connected between the first terminal and a second voltage. The second trigger voltage may be greater than the first voltage. The first transistor may include a drain extended n-type metal-oxide-semiconductor field-effect transistor (n-MOSFET). The second transistor may include a drain extended n-MOSFET.

The scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps/operations. In addition, each claim constitutes a separate embodiment, and the combination of various claims and embodiments are within the scope of the disclosure.

What is claimed is:

1. A circuit, comprising:
   a first transistor including a drain, a source, a gate, and a bulk, wherein the drain of the first transistor is connected to a first terminal, wherein the source of the first transistor is connected to receive a first voltage, and wherein the gate and the bulk of the first transistor are connected to receive a second voltage lower than the first voltage;
   a second transistor including a drain, a source, a gate, and a bulk, wherein the source, the gate, and the bulk of the second transistor are connected to receive the second voltage, and wherein the drain of the second transistor is connected to the first terminal; and
   a component connected between the first terminal and the source of the first transistor,
   wherein in response to the first terminal reaching a trigger voltage, the first transistor is configured to be turned on, and electrostatic charges are configured to be discharged through a first path including the first terminal, the drain of the first transistor, and the source of the first transistor.

2. The circuit of claim 1, wherein in response to the drain of the first transistor reaches the trigger voltage, the second transistor is configured to be turned on.

3. The circuit of claim 2, wherein the first transistor is configured to be turned on prior to the second transistor.

4. The circuit of claim 1, further comprising a power clamp module connected between the source of the first transistor and the source of the second transistor, wherein in response to the first transistor turning on, a first current flows from the source of the second transistor to the source of the first transistor through the power clamp module.

5. The circuit of claim 1, wherein the first transistor is configured to be turned off when the circuit is in a normal operation mode.

6. The circuit of claim 1, wherein the first transistor is configured to be turned on in response to an electrostatic discharge (ESD) PD mode strike occurring.

7. The circuit of claim 1, wherein the first transistor includes a drain extended n-type metal-oxide-semiconductor field-effect transistor (n-MOSFET), and the second transistor includes a drain extended n-MOSFET.

8. The circuit of claim 3, wherein the power clamp module includes a third transistor, a source of the third transistor is connected to receive the first voltage, and a bulk and a drain of the third transistor are connected to receive the second voltage.

9. The circuit of claim 8, wherein the third transistor is a big field-effect transistor.

10. The circuit of claim 9, further comprising a fourth transistor, a source connected to receive the first voltage, a drain and a bulk of the fourth transistor connected to receive the second voltage.

11. The circuit of claim 10, wherein the power clamp module includes a R-C inverter node connected to the gate of the fourth transistor.

12. A semiconductor device, comprising:
a first doped region of a first conductivity type;
a first doped stripe of the first conductivity type;
a second doped stripe of the first conductivity type;
a third doped stripe of the first conductivity type, wherein the first doped stripe is between the first doped region and the third doped stripe;
a fourth doped stripe of the first conductivity type, wherein the second doped stripe is between the first doped region and the fourth doped stripe;
a first polysilicon stripe between the first doped region and the first doped stripe;
a second polysilicon stripe between the first doped region and the second doped stripe;
a third polysilicon stripe between the first and third doped stripes; and
a fourth polysilicon stripe between the second and fourth doped stripes,
wherein the first and fourth doped stripes are configured to receive a first voltage, wherein the second and third doped stripes are configured to receive a second voltage lower than the first voltage, the first doped region is configured as a drain of a first transistor and a drain of a second transistor.

13. The semiconductor device of claim 12, wherein in response to the first doped region reaching a trigger voltage, the first doped region and the first doped stripe are conducted, and the first doped region and the fourth doped stripe are conducted.

14. The semiconductor device of claim 12, wherein the first, second, third, and fourth polysilicon stripe are configured to receive the second voltage.

15. The semiconductor device of claim 12, wherein the first and second polysilicon stripe are configured to receive the second voltage, and the third and fourth polysilicon stripe are connected to a R-C inverter node.

16. The semiconductor device of claim 15, wherein the third and fourth polysilicon stripe are a gate of an embedded n-type MOSFET.

17. The semiconductor device of claim 12, wherein in response to the first doped region reaching a second trigger voltage with respect to the second voltage, the first doped region and the third doped stripe are conducted, and the first doped region and the second doped stripe are conducted.

18. A method of operating a circuit, comprising:
in response to a first terminal reaching a first trigger voltage, turning on a first transistor connected between the first terminal and a first voltage, wherein a drain of the first transistor is connected to the first terminal, a source of the first transistor is connected to receive the first voltage, and a gate and a bulk of the first transistor are connected to receive a second voltage lower than the first voltage, and wherein electrostatic charges are configured to be discharged through a first path including the first terminal, the drain of the first transistor, and the source of the first transistor;
in response to the first terminal reaching a second trigger voltage, turning on a second transistor connected between the first terminal and a second voltage, wherein the second trigger voltage is greater than the first voltage, and wherein the source, the gate, and the bulk of the second transistor are connected to receive the second voltage, and the drain of the second transistor is connected to the first terminal.

19. The method of claim 18, further comprising, in response to the second transistor turning on, a first current flowing through a power clamp module.

20. The method of claim 19, further comprising, in response to the second transistor turning on, a second current flowing through a third transistor, wherein a gate of the third transistor is connected to a R-C inverter node of the power clamp module.

* * * * *